United States Patent
Takano et al.

(10) Patent No.: US 9,788,439 B2
(45) Date of Patent: Oct. 10, 2017

(54) MANUFACTURING METHOD OF MULTILAYER PRINTED WIRING BOARD

(71) Applicant: Nippon Mektron, Ltd., Tokyo (JP)

(72) Inventors: Shoji Takano, Tokyo-To (JP); Fumihiko Matsuda, Tokyo-To (JP)

(73) Assignee: NIPPON MEKTRON, LTD., Tokyo (JP)

( * ) Notice: Subject to any disclaimer, the term of this patent is extended or adjusted under 35 U.S.C. 154(b) by 0 days.

(21) Appl. No.: 15/022,292

(22) PCT Filed: Mar. 26, 2014

(86) PCT No.: PCT/JP2014/058587
§ 371 (c)(1),
(2) Date: Mar. 16, 2016

(87) PCT Pub. No.: WO2015/040878
PCT Pub. Date: Mar. 26, 2015

(65) Prior Publication Data
US 2016/0295707 A1    Oct. 6, 2016

(30) Foreign Application Priority Data

Sep. 20, 2013  (JP) ................................ 2013-196061

(51) Int. Cl.
| | |
|---|---|
| H05K 3/20 | (2006.01) |
| H05K 3/40 | (2006.01) |
| H05K 3/46 | (2006.01) |
| H05K 1/02 | (2006.01) |

(Continued)

(52) U.S. Cl.
CPC ......... *H05K 3/4069* (2013.01); *H05K 1/0298* (2013.01); *H05K 1/092* (2013.01);
(Continued)

(58) Field of Classification Search
CPC .... H05K 3/4069; H05K 3/4623; H05K 1/092; H05K 1/115; H05K 3/06; H05K 1/0298;
(Continued)

(56) References Cited

U.S. PATENT DOCUMENTS

| | | |
|---|---|---|
| 4,872,934 A | 10/1989 | Kameda |
| 6,440,542 B1 * | 8/2002 | Kariya ................ H05K 3/0035 174/262 |

(Continued)

FOREIGN PATENT DOCUMENTS

| | | |
|---|---|---|
| JP | 2631287 B2 | 7/1997 |
| JP | 2004-327510 A | 11/2004 |

(Continued)

OTHER PUBLICATIONS

Notiication of Resson for Rejection, dated Feb. 7, 2017, with English translation (10 pages).
International Search Report, dated Apr. 28 2014 (2 pages).

*Primary Examiner* — Donghai D Nguyen
(74) *Attorney, Agent, or Firm* — Jacobson Holman, PLLC.

(57) ABSTRACT

A wiring substrate is manufactured by attaching an adhesive protective film to a metal-foiled laminate sheet, forming bottomed via holes by partially removing the film and an insulating film, filling conductive pastes into the holes, and peeling the film. A wiring substrate is manufactured by forming an adhesive protective layer so as to cover a patterned metal foil on a metal-foiled laminate sheet, forming bottomed step via holes by partially removing the layer and an insulating film, filling conductive pastes into the holes, and peeling off a protective film. The wiring substrate and the second wiring substrate are laminated in such a way that protruding parts of the pastes come into contact with respective protruding parts of the pastes.

8 Claims, 14 Drawing Sheets

(51) Int. Cl.
*H05K 1/09* (2006.01)
*H05K 1/11* (2006.01)
*H05K 3/06* (2006.01)

(52) U.S. Cl.
CPC ............... *H05K 1/115* (2013.01); *H05K 3/06* (2013.01); *H05K 3/4617* (2013.01); *H05K 3/4623* (2013.01); *H05K 2201/0355* (2013.01); *H05K 2203/1383* (2013.01); *Y10T 29/49128* (2015.01); *Y10T 29/49165* (2015.01)

(58) Field of Classification Search
CPC ......... H05K 3/4617; H05K 2201/0355; H05K 2203/1383; H01L 21/268; Y10T 29/49126; Y10T 29/49128; Y10T 29/49155; Y10T 29/49165
USPC ............ 29/830, 831, 846, 852; 174/255, 262
See application file for complete search history.

(56) References Cited

U.S. PATENT DOCUMENTS

| | | | |
|---|---|---|---|
| 6,873,054 B2 * | 3/2005 | Miyazawa | ............ H01L 21/268 |
| | | | 174/255 |
| 6,931,723 B1 | 8/2005 | Powell | |
| 9,148,963 B2 * | 9/2015 | Matsuda | ............... H05K 3/4685 |

FOREIGN PATENT DOCUMENTS

| | | |
|---|---|---|
| JP | 2005-109307 A | 4/2005 |
| JP | 2007-96121 A | 4/2007 |
| JP | 2008-235561 A | 10/2008 |
| JP | 2010-62451 A | 3/2010 |
| JP | 2011-66293 A | 3/2011 |
| JP | 2013-41926 A | 2/2013 |

* cited by examiner

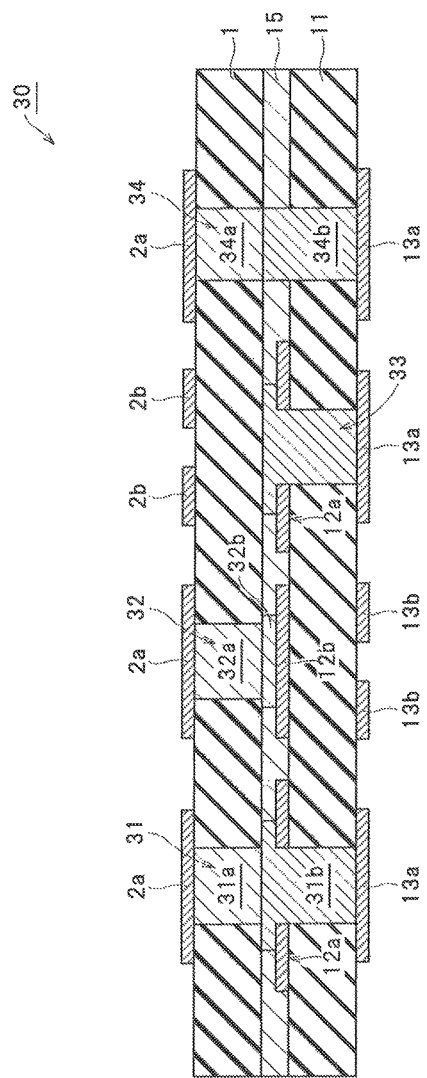
F I G. 3B

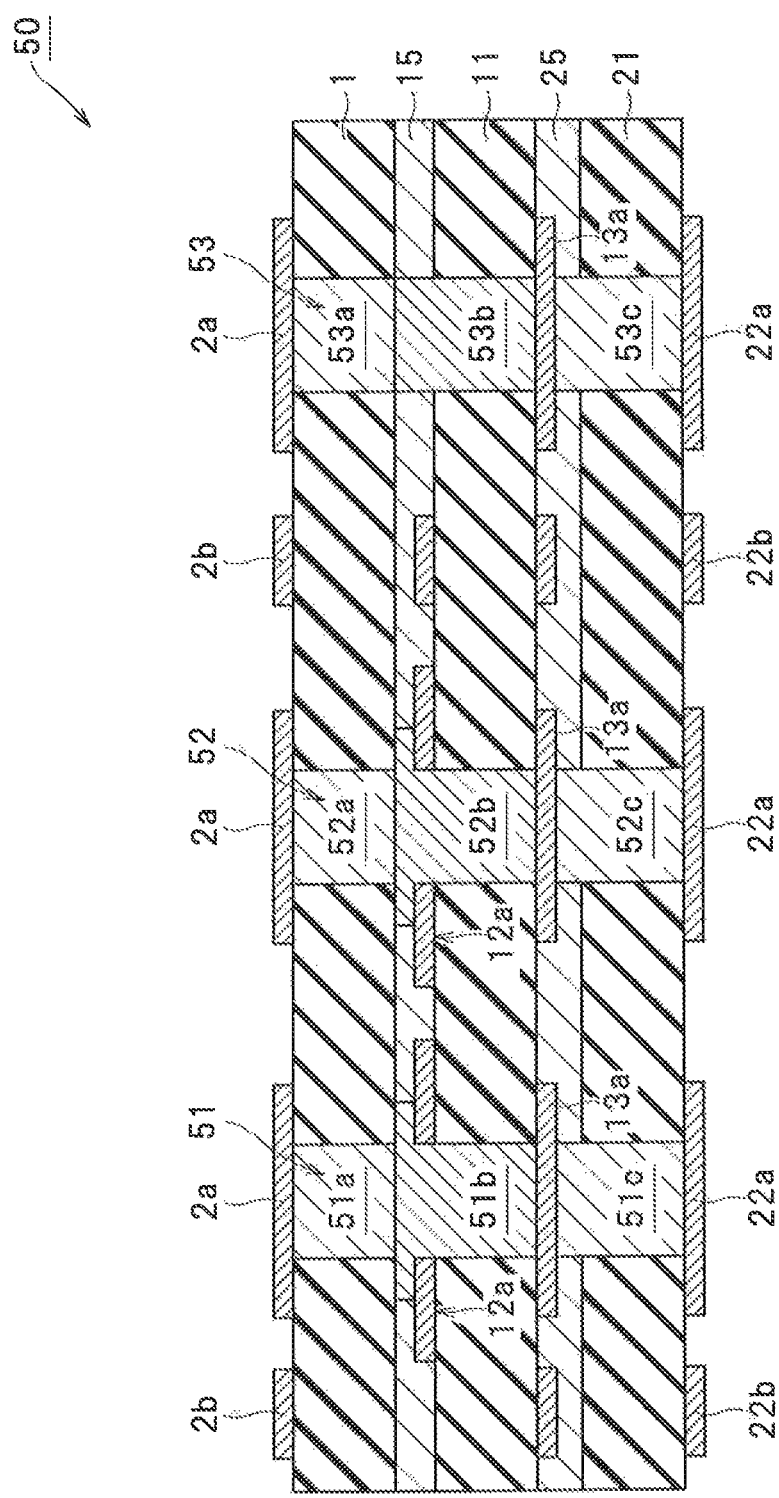
F I G. 5B

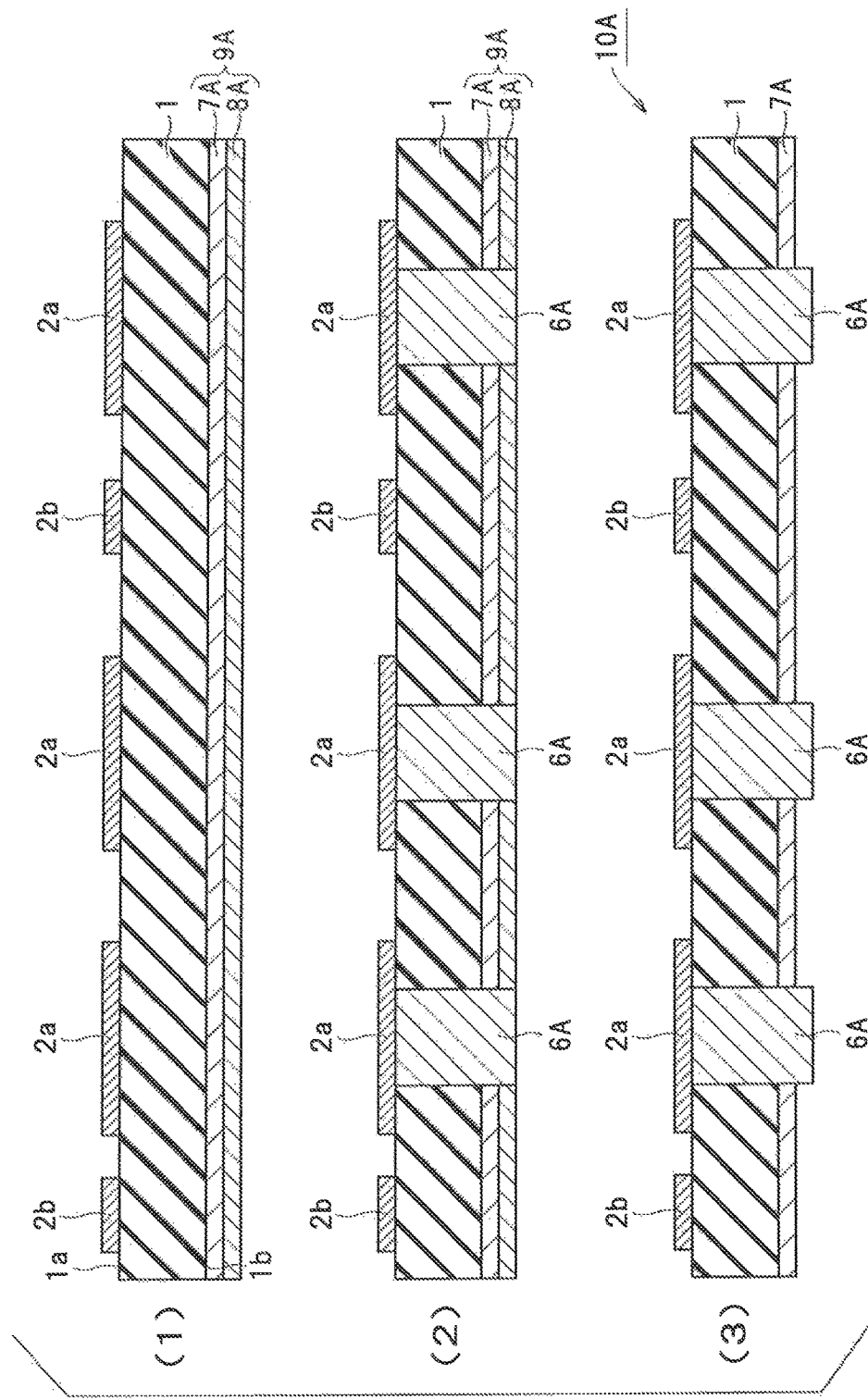
F I G. 6

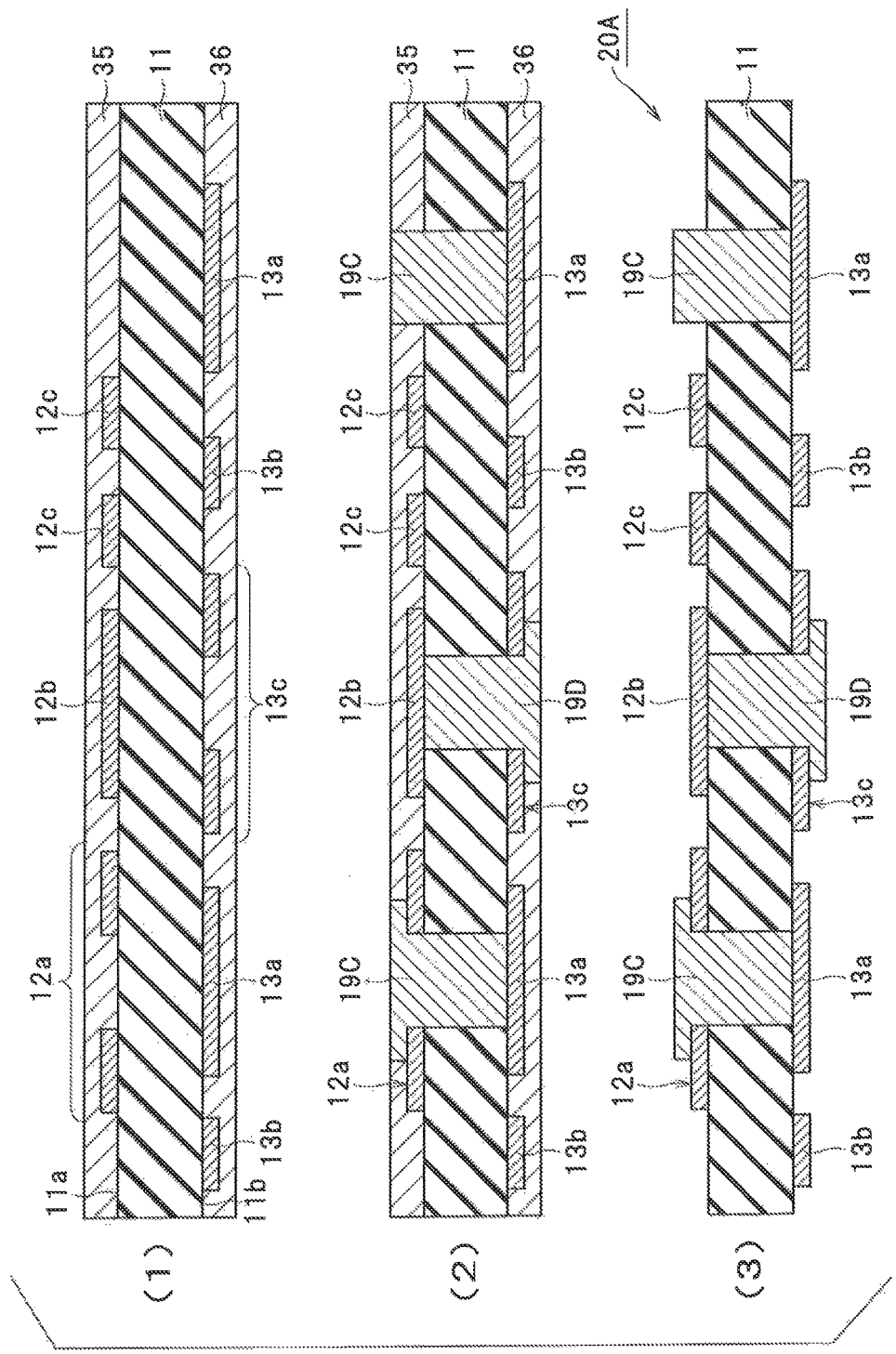
F I G. 7

MANUFACTURING METHOD OF MULTILAYER PRINTED WIRING BOARD

TECHNICAL FIELD

The present invention relates to a manufacturing method of a multilayer printed wiring board and the multilayer printed wiring board. More specifically, the present invention relates to a manufacturing method of a multilayer printed wiring board having three or more wiring layers that are interlayer connected through conductive vias formed of conductive paste and the multilayer printed wiring board.

BACKGROUND ART

Since electronic apparatuses have been downsized and the functionalities thereof have been advanced, the high densities of printed wiring boards having the various electronic devices mounted thereon have been demanded. In response to these demands, multi-layered printed wiring boards (multilayer printed wiring boards) have been developed.

To achieve the high density, for example, a hybrid multilayer circuit board has been developed (Patent Literature 1). The hybrid multilayer circuit board includes two multilayer circuit boards (hard circuit boards) and a flexible printed wiring board (or a flexible flat cable) that connects the multilayer circuit boards.

The above multilayer printed wiring boards and the hybrid multilayer circuit board have been widely used for small electronic devices such as laptop computers, digital cameras, portable communication devices, and game machines.

In such electronic devices, the signal transmission speed tends to become higher and higher because the amount of information handled by the electric devices particularly increases. For example, in personal computers, the transmission standard shifted to a standard with the transmission rate of 6 Gbps during 2010 to 2011. The importance of considering the signal loss in transmission lines is increasing.

Conventionally, a transmission line in a printed wiring board that transfers signals at a high speed is matched with a characteristic impedance. Accordingly, unnecessary reflection at respective boundaries among a signal driver, the transmission line, and a signal receiver is prevented, thereby preventing the deterioration in signal quality and securing the transmission characteristics. For example, a single end transmission line is designed generally so as to have a characteristic impedance of 50Ω.

When the resistive component in a transmission line is neglected, a characteristic impedance is expressed by Formula 1.

[Expression 1]

$$Z_0 = \sqrt{\frac{L}{C}} \quad (1)$$

In the above formula, $Z_0$ is a characteristic impedance, L is an inductance, and C is a capacitance.

As is seen from Formula 1, the value of the characteristic impedance is defined not only by physical properties such as the dielectric constant of the insulating layer, the conductivity of the wiring conductor, the permeability or the like in the printed wiring board but also by physical shapes such as the width and thickness of the transmission line (a signal line), the distance (that is, the thickness of the insulating layer) between the signal line and the ground layer, and the like.

CITATION LIST

Patent Literature

Patent Literature 1: Japanese Patent No. 2631287
Patent Literature 2: Japanese Patent Laid-Open No. 2011-66293
Patent Literature 3: Japanese Patent Laid-Open No. 2007-96121

SUMMARY OF INVENTION

Technical Problem

In recent years, due to the increasing signal speeds and the extended transmission lines, it is difficult to allow a conventional transmission loss. Therefore, a method of increasing the thickness of an insulator layer (a dielectric layer) forming a transmission line and increasing the width of a signal line has been applied to reduce the transmission loss while keeping a characteristic impedance constant. However, the transmission loss is becoming difficult to allow even by this method.

Accordingly, a liquid crystal polymer (LCP) is beginning to be used for an insulating layer of a flexible printed wiring board. The dielectric loss of the liquid crystal polymer is low due to its low dielectric constant and low dielectric loss tangent (tan δ) and thereby can reduce the transmission loss.

The dielectric loss has the relation with the dielectric constant and dielectric loss tangent shown in Formula (2).

[Expression 2]

$$\text{Loss} \propto \sqrt{\epsilon} \cdot \tan \delta \quad (2)$$

In the above formula, Loss is the dielectric loss, $\epsilon$ is the dielectric constant, and tan δ is the dielectric loss tangent.

Of materials that can be practically used for an insulating layer, a liquid crystal polymer is one of materials that have the lowest dielectric constant and dielectric loss tangent. Therefore, when a transmission loss smaller than a transmission loss obtained by the characteristics of a liquid crystal polymer is desired, a transmission loss needs to be reduced by increasing the width of the signal line and the thickness of the insulating layer as in the above case.

However, the thermal expansion coefficient of a liquid crystal polymer in a thickness direction is larger than that of an insulating material (e.g., polyimide) used in a conventional flexible printed wiring board. For this reason, the thermal expansion coefficient is largely different from that of a plated throughhole that has been generally used as an inter-layer connection path. When the insulating layer of the liquid crystal polymer is made thick, the reliability in temperature cycle or the like may be insufficient.

It has been proposed that in a printed wiring board using a liquid crystal polymer as an insulating layer, conductive vias using conductive pastes are used for an inter-layer connection path instead of plated throughholes (Patent Literatures 2 and 3). The conductive pastes are obtained by combining metal particles such as copper particles or silver particles to a resin binder such as epoxy.

However, in Patent Literatures 2 and 3, a multilayer printed wiring board is manufactured by laminating wiring substrates as many as wiring layers. Accordingly, the number of processes (piercing by laser processing, desmear treatment, printing of conductive pastes, and the like) for preparing the wiring substrates is large and increase in the number of the processes complicates preparation of necessary materials. As a result, the manufacturing cost of the multilayer printed wiring board increases.

When the number of wiring substrates to be laminated is large, the positional deviation amount that is a total of the expansion variation of the wiring substrates and the lamination variation during laminating the wiring substrates cumulatively increases, thereby deteriorating the yield. On the other hand, when the margin for positional deviation is made large, the high density of the multilayer printed wiring board is difficult to achieve.

The present invention has been made based on the above technical acknowledgements, and an object of the present invention is to provide a multilayer printed wiring board with an excellent yield that can reduce the manufacturing cost and easily achieve the high density.

Solution to Problem

A manufacturing method of a multilayer printed wiring board according to an embodiment of the present invention includes attaching an adhesive protective film having a weak adhesive layer formed on one side thereof to a single-sided metal-foiled laminate sheet having a first insulating resin film and a first metal foil on a front face of the first insulating resin film in such a way that the weak adhesive layer contacts with a rear face of the first insulating resin film, forming a bottomed via hole that has a bottom face with the first metal foil exposed therefrom by partially removing the adhesive protective film and the first insulating resin film, first printing of filling a conductive paste into the bottomed via hole by a printing method, peeling off the adhesive protective film from the first insulating resin film and causing a part of the conductive paste filled in the bottomed via hole to protrude from the first insulating resin film, and thereby obtaining a first wiring substrate, forming, on a double-sided metal-foiled laminate sheet having a second insulating resin film and second and third metal foils respectively provided on a front face and a rear face of the second insulating resin film, a piercing mask by patterning the second metal foil, forming an adhesive protective layer including an adhesive-agent layer that covers the front face of the second insulating resin film and buries the patterned second metal foil and a protective film that is laminated on the adhesive-agent layer, forming a bottomed step via hole that has a middle part with the piercing mask exposed therefrom and a bottom face with the third metal foil exposed therefrom by partially removing the adhesive protective layer and the second insulating resin film, second printing of filling a conductive paste into the bottomed step via hole by a printing method, peeling off the protective film from the adhesive-agent layer and causing a part of the conductive paste filled in the bottomed step via hole to protrude from the adhesive-agent layer, thereby obtaining a second wiring substrate, and laminating in which the first wiring substrate and the second wiring substrate are laminated in such a way that a protruding part of the conductive paste filled in the bottomed via hole of the first wiring substrate comes into contact with a protruding part of the conductive paste filled in the bottomed step via hole of the second wiring substrate, and the laminated first and second wiring substrates are heated to be integrated with each other.

Advantage Effects of Invention

In the present invention, the first wiring substrate that is obtained by using the single-sided metal-foiled laminate sheet as a starting material and causing the part of the conductive paste filled in the bottomed via hole to protrude from the first insulating resin film and the second wiring substrate that is obtained by using the double-sided metal-foiled laminate sheet as a starting material and causing the part of the conductive paste filled in the bottomed step via hole to protrude from the adhesive-agent layer are laminated in such a way that the protruding part of the conductive paste filled in the bottomed via hole of the first wiring substrate comes into contact with the protruding part of the conductive paste filled in the bottomed step via hole of the second wiring substrate.

The two wiring substrates are laminated in the above manner so that a multilayer printed wiring board having three wiring layers connected electrically with one another through conductive vias is provided.

Since the two wiring substrates are sufficient for the three wiring layers as described above, the number of materials required for manufacturing the multilayer printed wiring board can be reduced and the manufacturing processes can be simplified. Therefore, the manufacturing cost can be reduced and the multilayer printed wiring board can be provided inexpensively.

Furthermore, since it suffices that only the two wiring substrates are laminated, deterioration in yield caused by positional deviation can be avoided and the margin for positional deviation does not need to be large. Therefore, the present invention is effective for achieving the high density of the multilayer printed wiring board.

Therefore, the present invention can provide a multilayer printed wiring board with an excellent yield that can reduce the manufacturing cost and easily achieve the high density.

BRIEF DESCRIPTION OF DRAWINGS

FIG. 3B is a sectional view of the multilayer printed wiring board 30 according to the first embodiment of the present invention.

FIG. 5B is a sectional view of the multilayer printed wiring board 50 according to the second embodiment of the present invention.

FIG. 6 is a process sectional view for explaining a manufacturing method of a wiring substrate 10A of a multilayer printed wiring board 60 according to a third embodiment of the present invention.

FIG. 7 is a process sectional view for explaining a manufacturing method of a wiring substrate 20A of the multilayer printed wiring board 60 according to the third embodiment of the present invention.

DESCRIPTION OF EMBODIMENTS

Figure 1A:
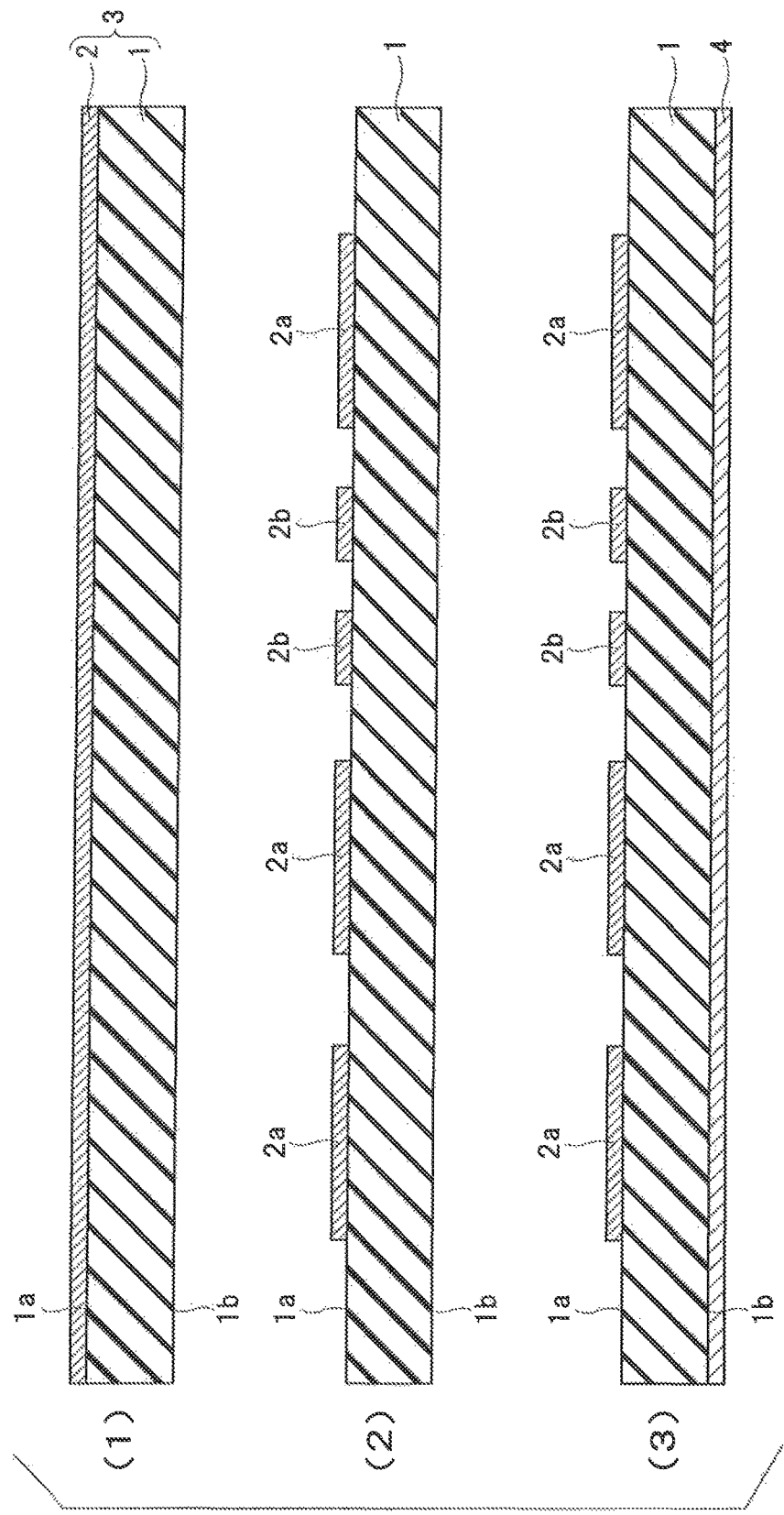
FIG. 1A is a process sectional view for explaining a manufacturing method of a wiring substrate 10 of a multilayer printed wiring board 30 according to a first embodiment of the present invention.

Hereinafter, embodiments of the present invention will be explained with reference to the drawings. Components having identical functions are denoted by same reference characters throughout the drawings and detailed explanations of a component denoted by a same reference character are not repeated basically. The drawings are schematic and the relation between thicknesses and plane dimensions, the ratio of thicknesses of layers, and the like in the drawings are different from those in the actual state.

First Embodiment

A first embodiment of the present invention will be explained with reference to FIGS. 1A to 3B.

Figure 3A:
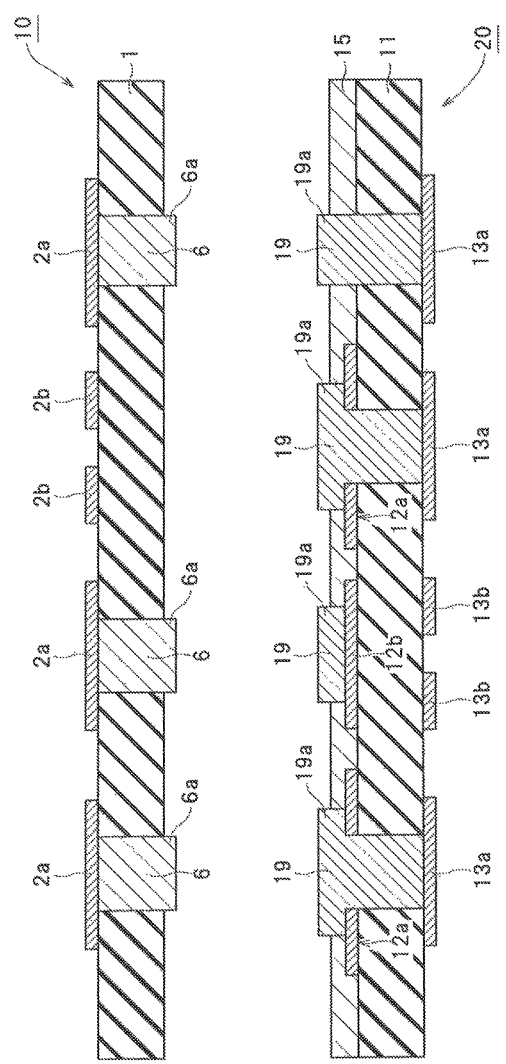
FIG. 3A is a process sectional view for explaining a manufacturing method of the multilayer printed wiring board 30 according to the first embodiment by laminating the wiring substrates 10 and 20.

As is clear from FIGS. 3A and 3B, a multilayer printed wiring board 30 according to the present embodiment is configured by laminating two wiring substrates (a wiring substrate 10 and a wiring substrate 20).

Figure 1B:
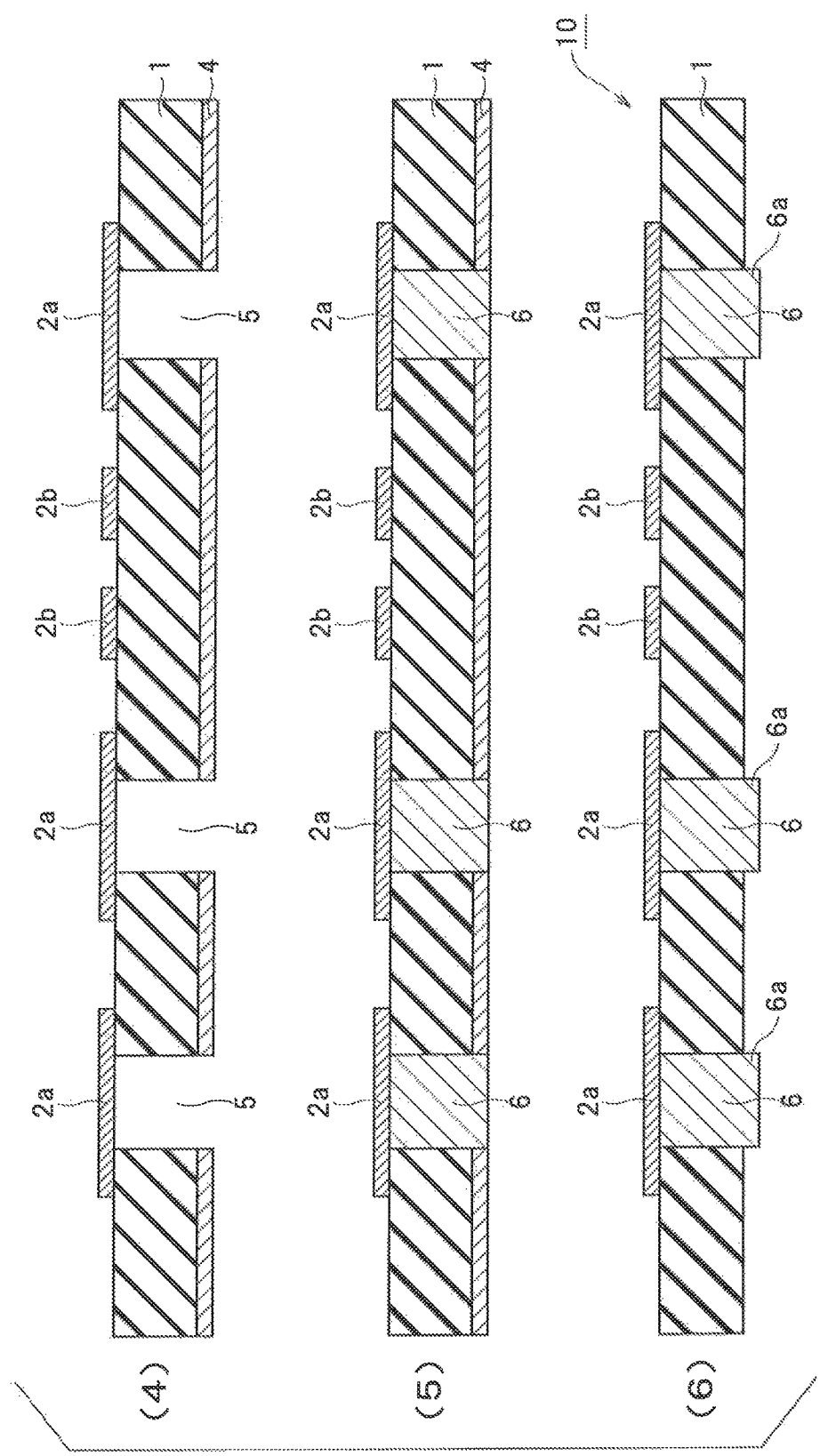
FIG. 1B is a process sectional view following FIG. 1A for explaining a manufacturing method of the wiring substrate 10 of the multilayer printed wiring board 30 according to the first embodiment of the present invention.
Figure 2A:
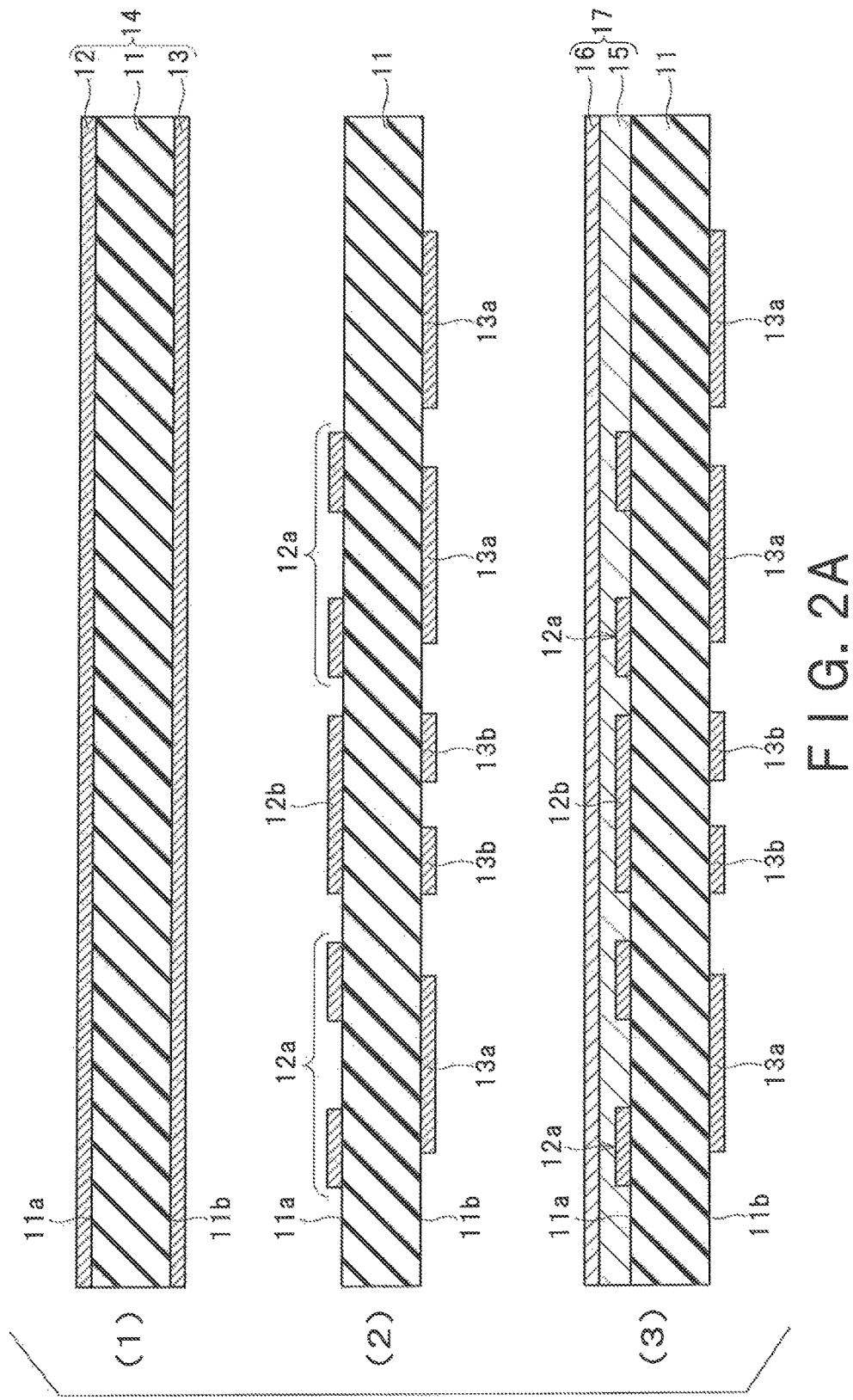
FIG. 2A is a process sectional view for explaining a manufacturing method of a wiring substrate 20 of the multilayer printed wiring board 30 according to the first embodiment of the present invention.
Figure 2B:
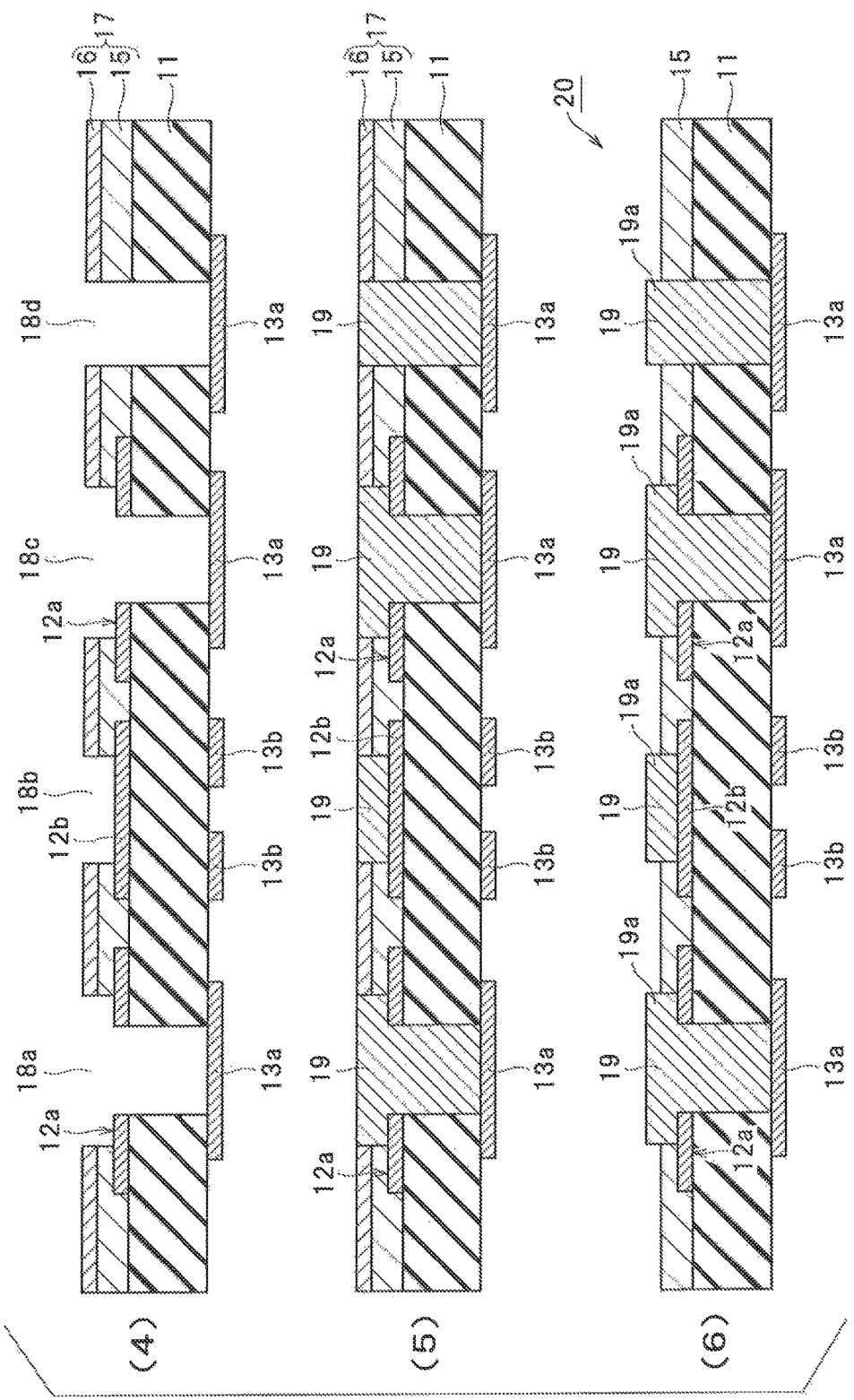
FIG. 2B is a process sectional view following FIG. 2A for explaining a manufacturing method of the wiring substrate 20 of the multilayer printed wiring board 30 according to the first embodiment of the present invention.

Explanations of a manufacturing method of the wiring substrate 10 with reference to FIGS. 1A and 1B are followed by explanations of a manufacturing method of the wiring substrate 20 with reference to FIGS. 2A and 2B. Explanations of a manufacturing method of the multilayer printed wiring board 30 with reference to FIGS. 3A and 3B follow these explanations.

First, a single-sided metal-foiled laminate sheet 3 having an insulating resin film 1 and a metal foil 2 on a front face 1a of the insulating resin film 1 is prepared as illustrated in (1) of FIG. 1A. The insulating resin film 1 is an insulating film (having a thickness of 100 μm, for example) formed of a liquid crystal polymer (LCP) or the like. The metal foil 2 is a copper foil (having a thickness of 12 μm, for example), for example. The metal foil 2 may be formed of metal (e.g., silver or aluminum) other than copper.

Subsequently, reception lands 2a and wirings 2b are formed by patterning the metal foil 2 by a known photofabrication method. The diameter of the reception land 2a is approximately φ250 μm, for example.

Subsequently, an adhesive protective film 4 is prepared. The adhesive protective film 4 is obtained by forming a weak adhesive film (having a thickness of 10 μm, for example) on one side of an insulating film (having a thickness of 20 μm, for example) made of PET or the like.

Subsequently, the adhesive protective film 4 having a weak adhesive layer (not illustrated) formed on one side thereof is attached to the single-sided metal-foiled laminate sheet 3 in such a way that the weak adhesive layer contacts with a rear face 1b of the insulating resin film 1 as illustrated in (3) of FIG. 1A.

Subsequently, the adhesive protective film 4 and the insulating resin film 1 are partially removed, thereby forming bottomed via holes (bottomed conducting holes) 5 each having a bottom face with the metal foil 2 exposed therefrom as illustrated in (4) of FIG. 1B. The diameter of the bottomed via hole 5 is φ150 to 200 μm, for example.

For example, the bottomed via holes 5 are formed by laser processing. In view of easiness in processing, an infrared laser such as a carbon dioxide laser is preferably used at this step. When a carbon dioxide laser is used, a beam diameter is made substantially equal to the desired hole diameter of the bottomed via hole 5. The bottomed via holes 5 may be formed using other lasers such as a UV-YAG laser.

Here, the dioxide-gas laser processing machine (ML605GTXIII-5100U2) manufactured by Mitsubishi Electric Corporation is used. The beam diameter is adjusted to 150 μm with a predetermined aperture or the like, the plus width is set to 10 μSec, energy per pulse is set to 5 mJ, and thereby forming one bottomed via hole 5 by five shots.

After irradiation of laser pulses, desmear treatment is performed to remove resin residues at the boundary between the insulating resin film 1 and the metal foil 2 (the reception lands 2a) and a treatment film on the rear face of the metal foil 2. The treatment film on the rear face of the metal foil 2 is a film (for example, a Ni/Cr film) that has been formed in manufacturing the single-sided metal-foiled laminate sheet 3 in order to improve the adhesion between the metal foil 2 that is a copper foil or the like and the insulating resin film 1.

Subsequently, conductive pastes 6 are filled into the bottomed via holes 5 by a printing method (a first printing process) as illustrated in (5) of FIG. 1B. More specifically, while the adhesive protective film 4 is used as a printing mask, the conductive pastes 6 are filled into the bottomed via holes 5 by a printing method such as screen printing. The conductive pastes 6 are obtained by dispersing metal particles on resin binder that is a pasty thermosetting resin.

Subsequently, the adhesive protective film 4 is peeled off from the insulating resin film 1. Accordingly, respective parts (protruding parts 6a) of the conductive pastes 6 filled in the bottomed via holes 5 are caused to protrude from the insulating resin film 1 as illustrated in (6) of FIG. 1B. The height of the protruding part 6a is substantially equal to the thickness of the adhesive protective film 4.

The above processes provide the wiring substrate 10 illustrated in (6) of FIG. 1B.

Next, a manufacturing method of the wiring substrate 20 will be explained with reference to FIGS. 2A and 2B.

First, a double-sided metal-foiled laminate sheet 14 having an insulating resin film 11 and metal foils 12 and 13 respectively placed on a front face 11a and a rear face 11b of the insulating resin film 11 is prepared as illustrated in (1)

of FIG. 2A. The insulating resin film 11 is an insulating film (having a thickness of 100 μm, for example) formed of a liquid crystal polymer or the like. For example, the metal foils 12 and 13 are copper foils (each having a thickness of 12 μm, for example). The metal foils 12 and 13 may be made of metal other than copper (e.g., silver, aluminum).

Subsequently, in the double-sided metal-foiled laminate sheet 14, piercing masks 12a, reception lands 12b and wirings (not illustrated) are formed by patterning the metal foil 12 by a known photofabrication method as illustrated in (2) of FIG. 2A. For example, the diameter of the piercing mask 12a is approximately ϕ350 μm. For example, the diameter of the reception land 12b is approximately ϕ250 μm. Similarly, reception lands 13a and wirings 13b are formed by patterning the metal foil 13. For example, the diameter of the reception land 13a is approximately ϕ250 μm.

The positioning accuracy between the piercing mask 12a and the reception land 13a is determined by the exposure accuracy. Therefore, the high positioning accuracy (for example, ±10 μm) can be obtained relatively easily, comparing with a conventional case in which two one-sided substrates are laminated.

Subsequently, an adhesive protective layer 17 that covers and protects the patterned metal foil 12 is formed on the double-sided metal-foiled laminate sheet 14 as illustrated in (3) of FIG. 2A. The adhesive protective layer 17 includes an adhesive-agent layer 15 and a protective film 16 laminated on the adhesive-agent layer 15. The adhesive-agent layer 15 covers the front face 11a of the insulating resin film 11 and buries the patterned metal foil 12.

The adhesive protective layer 17 can be formed by two kinds of methods, for example. In one method, the adhesive-agent layer 15 is first formed on the insulating resin film 11. For example, a low flow bonding sheet having a thickness of 15 μm is laminated on the insulating resin film 11. Thereafter, the protective film 16 is laminated on the adhesive-agent layer 15. For example, the protective film 16 (having a thickness of 20 μm, for example) made of PET or the like is attached to the adhesive-agent layer 15.

In the other method, a film that is obtained by providing the adhesive-agent layer 15 on one side of the protective film 16 is attached to the insulating resin film 11.

In the both methods, when the adhesive-agent layer 15 or the film obtained by providing the adhesive-agent layer 15 on one side of the protective film 16 is laminated, the laminating needs to be performed at a lower temperature than the thermosetting temperature of the adhesive-agent layer 15 so as to fill the patterned metal foil 12 while maintaining the adhesiveness required for a laminating process which will be described later.

Roughing treatment may be performed to the metal foil 12 before the adhesive protective layer 17 is formed. The roughing treatment can improve the adhesion strength between the metal foil 12 and the adhesive-agent layer 15. Here, the roughing treatment is performed to the copper foil that is the metal foil 12 using Neo Brown NBD series manufactured by Ebara-Udylite Co., Ltd.

Subsequently, the adhesive protective layer 17 and the insulating resin film 11 are partially removed, thereby forming bottomed step via holes 18a each having a middle part with the piercing mask 12a exposed therefrom and a bottom face with the metal foil 13 (the reception land 13a) therefrom as illustrated in (4) of FIG. 2B.

In this process, in addition to the bottomed step via holes 18a, bottomed via holes 18b and 18d and bottomed step via holes 18c are formed as illustrated in (4) of FIG. 2B. The bottomed via hole 18b is a bottomed via hole that penetrates the adhesive protective layer 17 in the thickness direction and has a bottom face with the reception land 12b exposed therefrom. The bottomed step via hole 18c is a bottomed step via hole having a same structure as the bottomed step via hole 18a. The bottomed via hole 18d is a bottomed via hole that penetrates the adhesive protective layer 17 and the insulating resin film 11 in the thickness direction and has a bottom face with the reception land 13a exposed therefrom.

Considering the positional deviation at the laminating process which will be described later, the diameter of the bottomed step via hole 18a is preferably larger than that of the bottomed via hole 5, for example, ϕ250 to 300 μm.

Here, the above dioxide-gas laser processing machine is used and the beam diameter is adjusted to 250 μm with a predetermined aperture or the like, the pulse width is set to 10 μSec, energy per pulse is set to 5 mJ, thereby forming one bottomed step via hole 18a by six shots. In the bottomed via hole 18b, the beam diameter is adjusted to 200 μm, the pulse width is set to 10 μSec, energy per pulse is set to 5 mJ, thereby forming one bottomed via hole 18b by two shots. In the bottomed via hole 18d, the beam diameter is adjusted to 250 μm, the pulse width is set to 10 μSec, energy per pulse is set to 5 mJ, thereby forming one bottomed via hole 18d by six shots.

After irradiation of laser pulses, desmear treatment is performed to the bottomed step via holes 18a and 18c and the bottomed via holes 18b and 18d. Consequently, resin residues at the boundary between the insulating resin film 11 and the metal foil 13 (the reception lands 13a) and a treatment film on the rear face of the metal foil 13 as well as resin residues at the boundary between the insulating resin film 11 and the metal foil 12 (the piercing masks 12a) and a film formed by the roughing treatment on the front face (the top surface) of the metal foil 12 are removed.

Subsequently, conductive pastes 19 are filled into the bottomed step via holes 18a and 18c and the bottomed via holes 18b and 18d, by a printing method (a second printing process) as illustrated in (5) of FIG. 28. More specifically, while the protective film 16 is used as a printing mask, the conductive pastes 19 are filled into the bottomed step via holes 18a and 18c and the bottomed via holes 18b and 18d by a printing method such as screen printing. The conductive pastes 19 are obtained by dispersing metal particles on resin binder that is a pasty thermosetting resin.

Subsequently, the protective film 16 is peeled off from the adhesive-agent layer 15. Accordingly, respective parts (protruding parts 19a) of the conductive pastes 19 filled in the bottomed step via holes 18a and 18c and the bottomed via holes 18b and 18d protrude from the adhesive-agent layer 15 as illustrated in (6) of FIG. 2B. The height of the protruding part 19a is substantially equal to the thickness of the protective film 16.

The above processes provide the wring substrate 20 illustrated in (6) of FIG. 2B.

Next, a manufacturing method of the multilayer printed wiring board 30 will be explained with reference to FIGS. 3A and 3B.

The wiring substrate 10 and the wiring substrate 20 are positioned to be opposed to each other and the wiring substrate 10 and the wiring substrate 20 are laminated in such a way that the protruding parts 6a of the conductive pastes 6 come into contact with the respective protruding parts 19a of the conductive pastes 19 as illustrated in FIG. 3A. The laminated wiring substrates 10 and 20 (hereinafter, also referred to as "laminate body") are heated to be integrated with each other (the laminating process).

More specifically, the laminate body is heated and pressurized with a vacuum press apparatus or a vacuum laminator apparatus. For example, the laminate body is heated to approximately 200° C. and is pressurized at several MPa. This temperature is lower than the softening temperature of a liquid crystal polymer by 50° C. or more.

When a vacuum press apparatus is used, the laminate body is left under the above heating and pressurizing condition for approximately 30 to 60 minutes, for example. Consequently, heat curing of the adhesive-agent layer 15 and heat curing of the binder resin of the conductive pastes 6 and 19 are completed.

When a vacuum laminator apparatus is used, the heating and pressurizing time is several minutes. The heat-curing reaction is uncompleted when the heating and pressurizing are finished. Therefore, the laminate body is transferred from the vacuum laminator apparatus to an oven apparatus and post cure treatment is performed to the laminate body. In the post cure treatment, the laminate body is heated to approximately 200° C. for approximately 60 minutes, for example. Consequently, heat curing of the adhesive-agent layer 15 and heat curing of the binder resin of the conductive pastes 6 and 19 are completed.

Even when either of a vacuum press apparatus and a vacuum laminator apparatus is used, heating at a predetermined laminating-process temperature is performed, thereby causing the metallic bonding among the metallic particles included in the conductive pastes 6 and 19 as well as the metallic bonding among the metallic particles and the metal foils 2, 12, and 13 (the reception lands 2a, 12b, and 13a and the piercing masks 12a). Consequently, conductive vias 31 to 34 for interlayer connection are formed as illustrated in FIG. 3B. Furthermore, this heating substantially completes both of the heat-curing reaction of the resin binder of the conductive pastes 6 and 19 and the heat-curing reaction of the adhesive-agent layer 15.

To achieve the metallic bonding among the metallic particles included in the conductive pastes 6 and 19 by the heating at the laminating-process temperature (for example, approximately 200° C.), the melting point of the metallic particles is preferably lower than the laminating-process temperature. Examples of metal having such a low melting point include In, SnIn, and SnBi. Therefore, in the above printing processes (the first printing process and/or the second printing process) of conductive pastes, the conductive pastes to be used here preferably include metal particles made of the above metal having a low melting point.

When the metal foils 11, 12, and 13 are copper foils, conductive pastes including metal particles made of Sn, Zn, Al, Ag, Ni, Cu or an alloy of these metals are preferably used in the above printing processes (the first printing process and/or the second printing process) of conductive pastes. Accordingly, the heating at the laminating-process temperature (for example, approximately 200° C.) causes the metallic particles included in the conductive pastes 6 and 19 to form an alloy layer with the copper foils to achieve the metallic bonding.

After the above laminating process, surface treatment to a wiring layer that is exposed to the outside, forming of a solder resist or the like, and outer-shape processing are performed as needed.

The above processes provide the wiring layer (the first wiring layer) including the reception lands 2a and the wirings 2b, the inside wiring layer (the second wiring layer) including the piercing masks 12a and the reception lands 12b, and the wiring layer (the third wiring layer) including the reception lands 13a and the wirings 13b as illustrated in FIG. 3B.

As illustrated in FIG. 3B, the multilayer printed wiring board 30 includes the insulating resin film 11, the reception lands 13a on the lower face of the insulating resin film 11, the piercing masks 12a on the upper face of the insulating resin film 11, the insulating resin film 1 laminated on the upper face of the insulating resin film 11 through the adhesive-agent layer 15 burring the piercing masks 12a, the reception lands 2a on the upper face of the insulating resin film 1, and the conductive vias 31 to 34.

The conductive via 31 is provided to penetrate the insulating resin film 11, the adhesive-agent layer 15, and the insulating resin film 1 in the thickness direction and connects the reception lands 13a, the reception lands 2a, and the piercing masks 12a electrically with one another. In this way, the conductive via 31 connects all of the first to third wiring layers electrically.

In contrast, the conductive via 32 connects the first wiring layer and the second wiring layer electrically, the conductive via 33 connects the second wiring layer and the third wiring layer electrically, and the conductive via 34 connects the first wiring layer and the third wiring layer electrically. In this way, all the combinations of interlayer connection are achieved.

As illustrated in FIG. 3B, more specifically, the conductive via 31 includes an upper conductive via part 31a that penetrates the insulating resin film 1 in the thickness direction and a lower conductive via part 31b that penetrates the adhesive-agent layer 15 and the insulating resin film 11 in the thickness direction. The upper conductive via part 31a and the lower conductive via part 31b come into contact with each other at the interface between the insulating resin film 1 and the adhesive-agent layer 15.

The upper conductive via part 31a is formed by curing the conductive paste filled in the bottomed via hole that has a bottom face with the reception land 2a exposed therefrom. The lower conductive via part 31b is formed by curing the conductive paste filled in the bottomed step via hole that has a middle part with the piercing mask 12a exposed therefrom and a bottom face with the reception land 13a exposed therefrom.

The conductive via 32 is formed by causing conductive via parts 32a and 32b to come into contact with each other at the interface between the insulating resin film 1 and the adhesive-agent layer 15. The conductive via 34 is formed by causing conductive via parts 34a and 34b to come into contact with each other at the interface between the insulating resin film 1 and the adhesive-agent layer 15.

In the above manufacturing method of the multilayer printed wiring board 30, the metal foil 2 and the metal foil 13 are patterned to form respective predetermined wiring patterns before the laminating process of laminating and integrating the wiring substrate 10 and the wiring substrate 20. However, the present invention is not limited to the above manufacturing method. That is, the metal foil 2 and the metal foil 13 are patterned to form respective predetermined wiring patterns after the laminating process. In this case, the patterning can be performed while positioning to the second wiring layer has been performed. Thus, the first and third wiring layers can be formed with higher accuracy. Moreover, this method is effective when the variation in dimensional contraction of the wiring substrates 10 and 20 is large in the laminating process.

The metal foil 2 and the metal foil 13 may be patterned simultaneously by both-side simultaneous exposure. In this case, the positioning of the first wiring layer and the third wiring layer can be performed with higher accuracy than the positional accuracy (the laminating accuracy) of laminating the wiring substrate 10 and the wiring substrate 20.

The thicknesses of the adhesive protective film 4 and the protective film 16 define the heights (the protruding amounts of the conductive pastes) of the protruding parts 6a and 19a of the conductive pastes 6 and 19. When these films are excessively thick, the protruding parts 6a and 19a excessively protrude. Thus, the adhesive-agent layer 15 cannot absorb the unevenness on the multilayer printed wiring board 30 completely in the laminating process and flatness of the multilayer printed wiring board 30 may be deteriorated. On the other hand, when these films are excessively thin, the heights of the protruding parts 6a and 19a are excessively low. Thus, even when the laminate body is pressurized in the laminating process, the bonding between the conducive via parts (for example, the conductive via part 31a and the conductive via part 31b) is weak so that the connection reliability of the conductive vias 31, 32, and 34 may be insufficient. Therefore, each of the thicknesses of the adhesive protective film 4 and the protective film 16 is preferably in a range of 20±10 µm, more preferably in a range of 20±5 µm.

In the above first and second printing processes, in order to prevent the contamination of air voids, the printing of the conductive pastes 6 and 19 are performed preferably under vacuum environment. For example, a vacuum printer for screen printing is preferably used. Thus, even when a void (an area not filled with a conductive paste) is generated during the printing, the void disappears by being pressed by the atmosphere at the release of the vacuum state. In this way, air voids are prevented from generating. However, when the diameters of the bottomed via holes 5 or the bottomed step via holes 18a are relatively small, the probability of air voids generating is low and the printing under a vacuum environment is not always necessary.

As described above, in the first embodiment, the multilayer printed wiring board 30 having three wiring layers that are connected electrically with one another via conductive vias is manufactured by laminating two wiring substrates (the wiring substrate 10 and the wiring substrate 20).

Since the two wiring substrates are sufficient for the three wiring layers as described above, the number of materials required for manufacturing the multilayer printed wiring board can be reduced and the manufacturing process can be simplified. Therefore, the manufacturing cost can be reduced and the multilayer printed wiring board 30 can be provided inexpensively.

Since it suffices that only two wiring substrates are laminated, deterioration in yield caused by positional deviation can be avoided and the margin for positional deviation does not need to be large. Therefore, the above manufacturing method is effective for achieving the high density of the multilayer printed wiring board.

Therefore, according to the first embodiment, it is possible to provide a multilayer printed wiring board with an excellent yield that can reduce the manufacturing cost and easily achieve the high density Second Embodiment A second embodiment of the present invention will be explained with reference to FIGS. 4, 5A and 5B. One of the differences between the second embodiment and the first embodiment is the number of wiring layers. While the multilayer printed wiring board 30 according to first embodiment has three wiring layers, a multilayer printed wiring board 50 according to the second embodiment has four wiring layers.

Figure 5A:
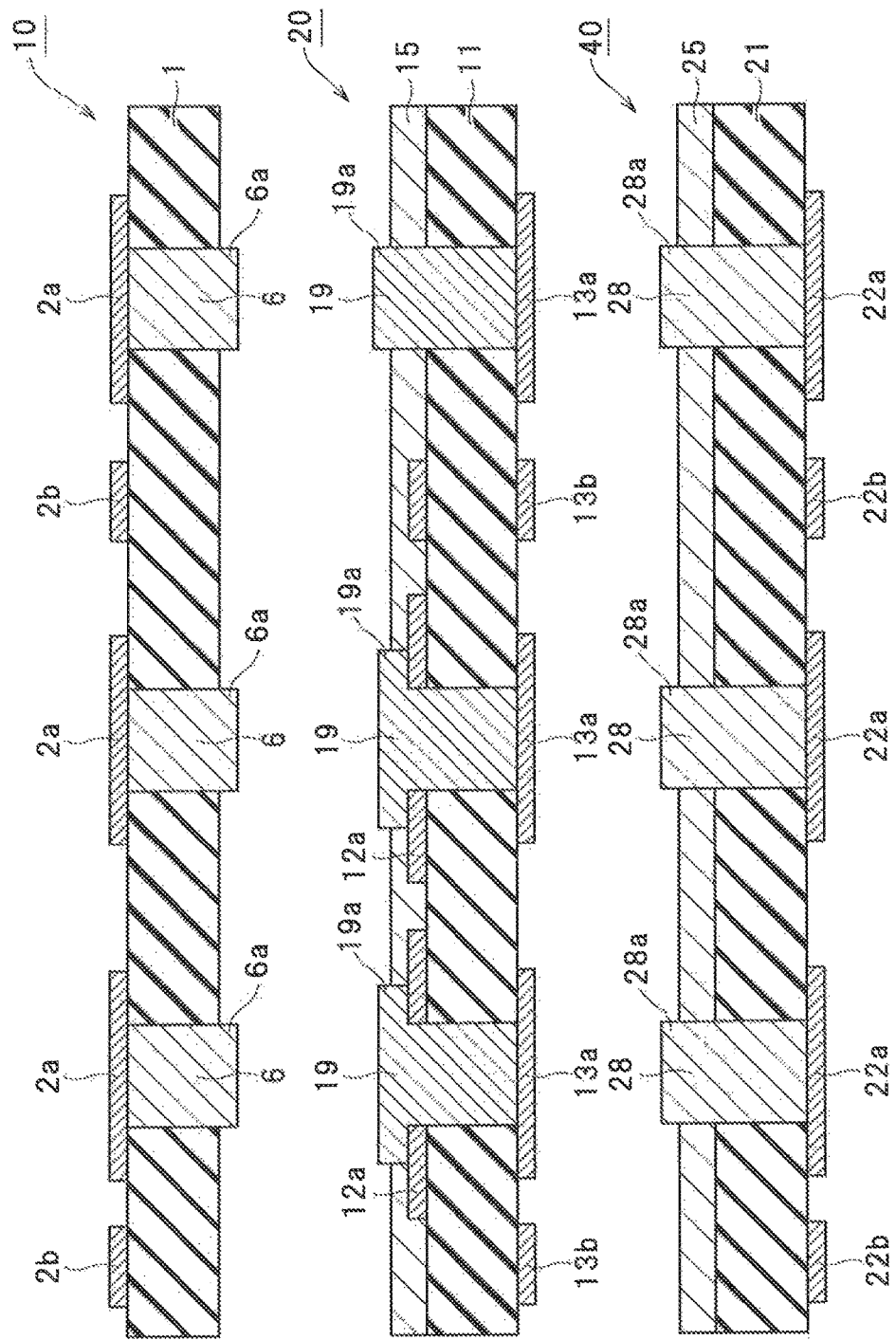
FIG. 5A is a process sectional view for explaining a manufacturing method of the multilayer printed wiring board 50 according to the second embodiment by laminating the wiring substrates 10, 20, and 40.

As is clear from FIGS. 5A and 5B, the multilayer printed wiring board 50 according to the present embodiment is configured by laminating three wiring substrates (the wiring substrate 10, the wiring substrate 20, and a wiring substrate 40).

The manufacturing methods of the wiring substrate 10 and the wiring substrate 20 are identical to those in the first embodiment, and therefore, detailed explanations thereof are omitted.

A manufacturing method of the wiring substrate 40 will be explained with reference to FIG. 4.

Figure 4:
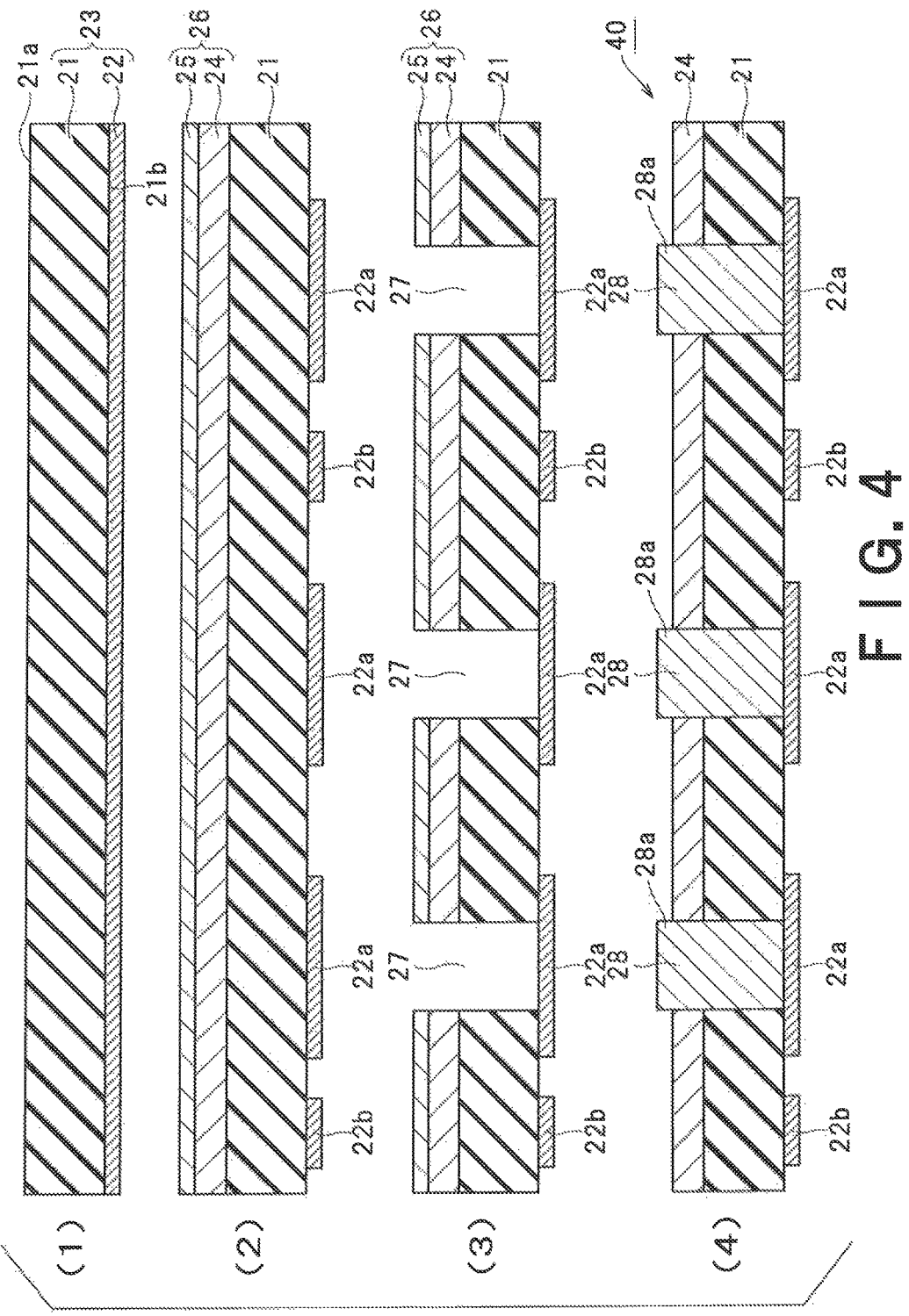
FIG. 4 is a process sectional view for explaining a manufacturing method of a wiring substrate 40 of a multilayer printed wiring board 50 according to a second embodiment of the present invention.

First, a single-sided metal-foiled laminate sheet 23 having an insulating resin film 21 and a metal foil 22 on a rear face 21b of the insulating resin film 21 is prepared as illustrated in (1) of FIG. 4. The insulating resin film 21 (having a thickness of 100 µm, for example) is formed of a liquid crystal polymer (LCP) or the like. The metal foil 22 is a copper foil or the like (having a thickness of 12 µm, for example). The metal foil 22 may be formed of metal (e.g., silver or aluminum) other than copper.

Subsequently, in the single-sided metal-foiled laminate sheet 23, reception lands 22a and wirings 22b are formed by patterning the metal foil 22 by a known photofabrication method. The diameter of the reception land 22a is approximately 0250 µm, for example.

Subsequently, an adhesive protective layer 26 is formed on a front face 21a of the single-sided metal-foiled laminate sheet 23 as illustrated in (2) of FIG. 4. The adhesive protective layer 26 includes an adhesive-agent layer 24 that covers the front face 21a of the insulating resin film 21 and a protective film 25 that is laminated on the adhesive-agent layer 24. The forming method of the adhesive protective layer 26 is identical to that of the adhesive protective layer 17 in the first embodiment, and therefore, explanations thereof are omitted.

Subsequently, the adhesive protective layer 26 and the insulating resin film 21 are partially removed, thereby forming bottomed via holes 27 each having a bottom face with the metal foil 22 (a reception land 22a) exposed therefrom as illustrated in (3) of FIG. 4. The forming method of the bottomed via hole 27 is identical to that of the bottomed via hole 18d or the like in the first embodiment, and therefore, explanations thereof are omitted.

Subsequently, conductive pastes 28 are filled into the bottomed via holes 27 by a printing method as illustrated in (4) of FIG. 4. The filling method of the conductive pastes 28 is identical to that of the conductive pastes 6 or the like in the first embodiment, and therefore, explanations thereof are omitted.

Subsequently, the protective film 25 is peeled off from the adhesive-agent layer 24, thereby causing respective parts (protruding parts 28a) of the conductive pastes 28 filled in the bottomed via holes 27 to protrude from the adhesive-agent layer 24 as illustrated in (4) of FIG. 4.

The above processes provide the wiring substrate 40 illustrated in (4) of FIG. 4.

A manufacturing method of the multilayer printed wiring board 50 will be explained with reference to FIGS. 5A and 5B.

As illustrated in FIG. 5, the wiring substrate 10, the wiring substrate 20, and the wiring substrate 40 are positioned to be opposed to one another and the wiring substrate 10, the wiring substrate 20, and the wiring substrate 40 are laminated in such a way that the protruding parts 6a of the conductive pastes 6 come into contact with the respective protruding parts 19a of the conductive pastes 19 and the protruding parts 28a of the conductive pastes 28 come into contact with the respective reception lands 13a of the wiring substrate 20. The laminated wiring substrates 10, 20, and 40 are heated to be integrated with one another (a laminating process). The laminating process is identical to that in the first embodiment, and therefore, detailed explanations thereof are omitted.

The above processes provide the multilayer printed wiring board 50 having first to fourth wiring layers as illustrated in FIG. 5B. The first to third wiring layers are identical to those in the first embodiment and the fourth wiring layer is the lowest wiring layer including the reception lands 22a and the wirings 22b.

As illustrated in FIG. 5B, the multilayer printed wiring board 50 includes conductive vias 51 to 53. The conductive vias 51 and 52 connect all of the first to fourth wiring layers electrically. The conductive via 53 connects the first wiring layer, the third wiring layer, and the fourth wiring layer electrically by skipping the second wiring layer.

The conductive via 51 is formed of conductive via parts 51a, 51b, and 51c. The conductive via 52 is formed of conductive via parts 52a, 52b, and 52c. The conductive via 53 is formed of conductive via parts 53a, 53b, and 53c.

As is clear from FIGS. 3B and 5B, a conductive via for connecting any two or more layers of the first to fourth wiring layers can be formed.

As described above, in the second embodiment, the multilayer printed wiring board 50 having four wiring layers connected electrically with one another through the conductive vias is manufactured by laminating three wiring substrates (the wiring substrate 10, the wiring substrate 20, and the wiring substrate 40).

According to the second embodiment, the three wiring substrates are sufficient for the four wiring layers. Thus, the number of materials required for manufacturing the multilayer printed wiring board can be reduced and the manufacturing process can be simplified.

Since it suffices that only three wiring substrates are laminated, deterioration in yield caused by positional deviation can be avoided. Since the margin for positional deviation does not need to be large, the above manufacturing method is effective for achieving the high density of the multilayer printed wiring board.

Therefore, according to the second embodiment, it is possible to provide a multilayer printed wiring board with an excellent yield that can reduce the manufacturing cost and easily achieve the high density Third Embodiment A third embodiment of the present invention will be explained with reference to FIGS. 6 to 9B. Similarly to the second embodiment, the third embodiment is a multilayer printed wiring board having four wiring layers. One of the differences between the third embodiment and the second embodiment is the positions of piercing masks. That is, while the piercing masks 12a are formed only on one main surface of the insulating resin film 11 in the second embodiment, lands (piercing masks) having a large diameter are formed on the both sides of the insulating resin film in order to achieve the high density in the third embodiment.

Figure 9A:
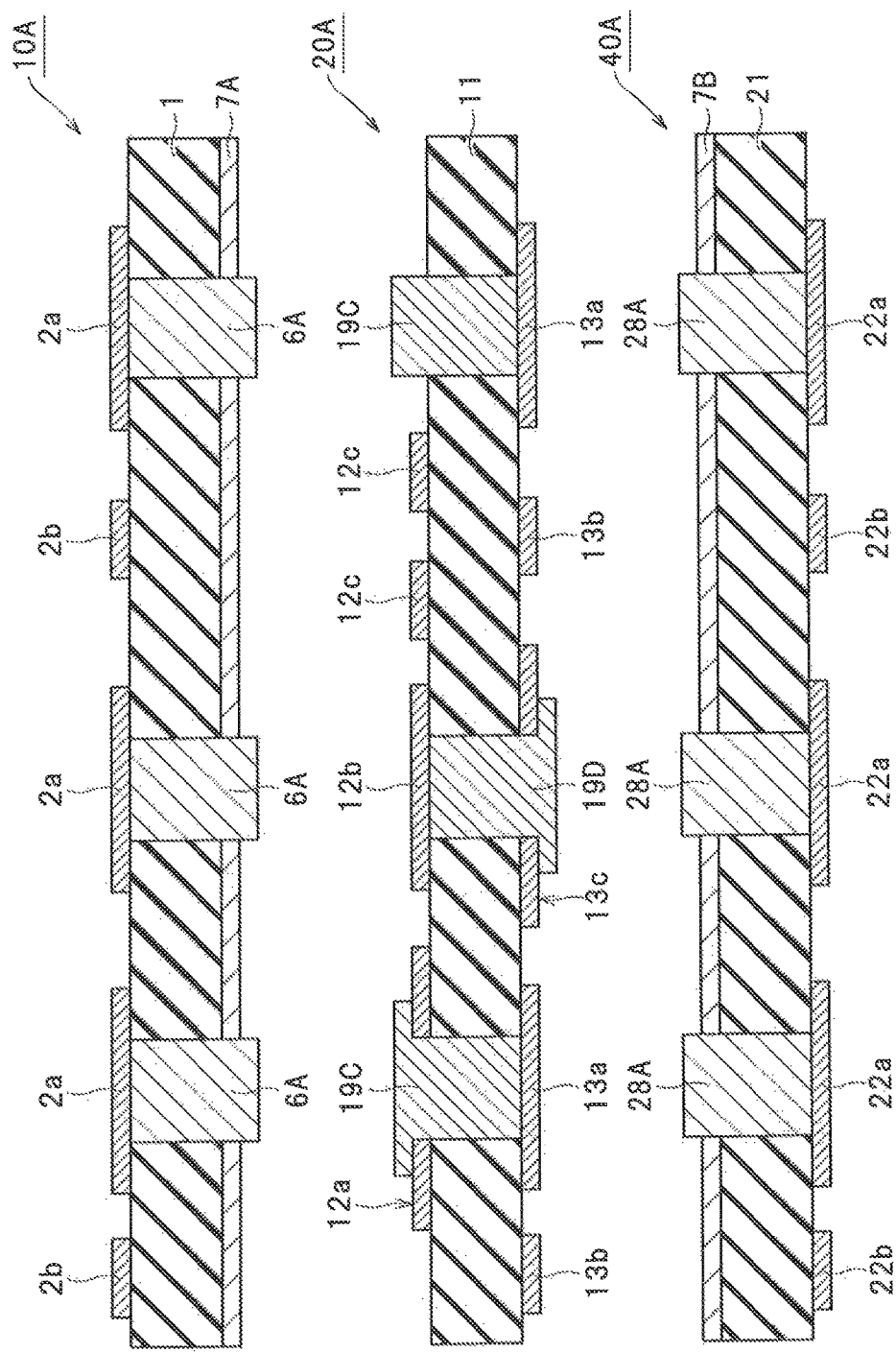
FIG. 9A is a process sectional view for explaining a manufacturing method of the multilayer printed wiring board 60 according to the third embodiment by laminating the wiring substrates 10A, 20A, and 40A.
Figure 9B:
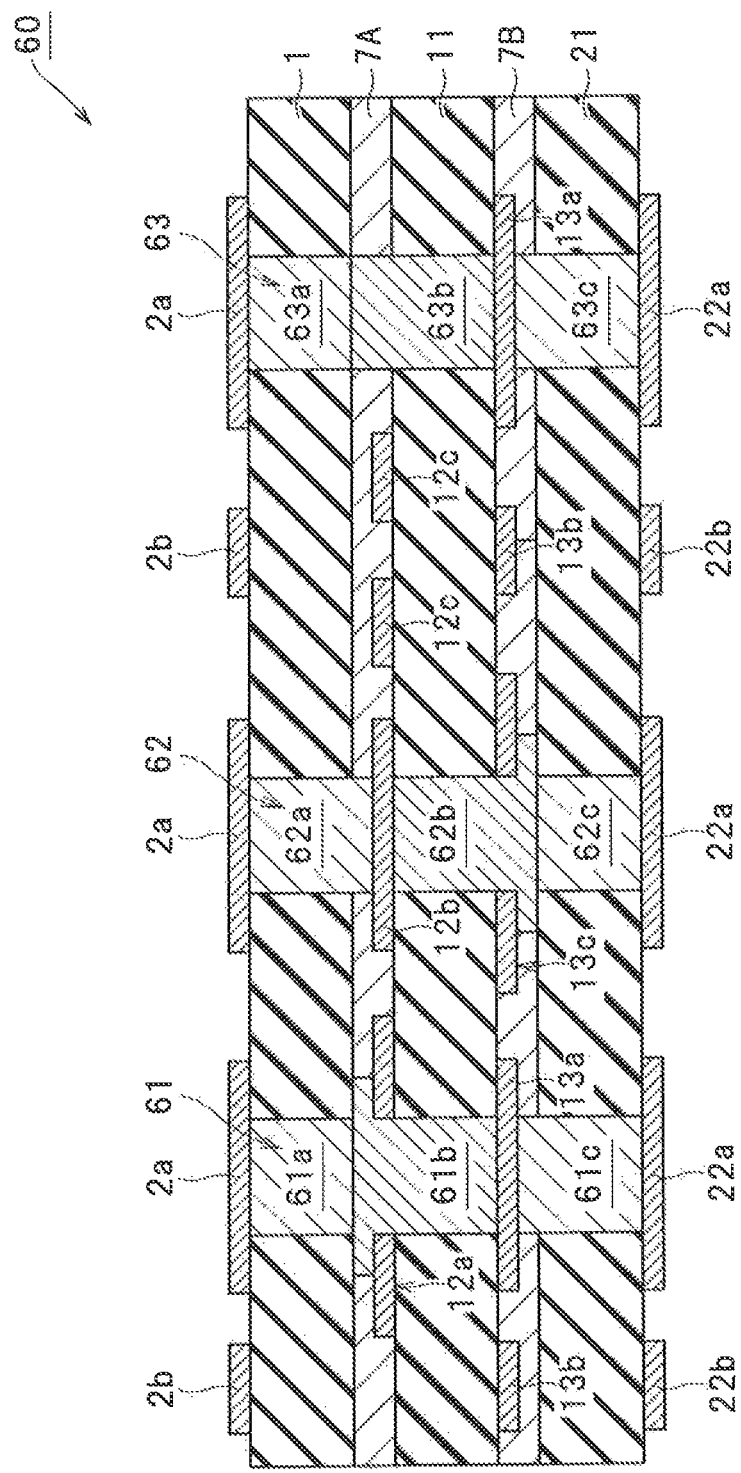
FIG. 9B is a sectional view of the multilayer printed wiring board 60 according to the third embodiment of the present invention.

As is clear from FIGS. 9A and 9B, a multilayer printed wiring board 60 according to the present embodiment is configured by laminating three wiring substrates (a wiring substrate 10A, a wiring substrate 20A, and a wiring substrate 40A).

Explanations of a manufacturing method of the wiring substrate 10A with reference to FIG. 6, explanations of a manufacturing method of the wiring substrate 20A with reference to FIG. 7, and explanations of a manufacturing method of the wiring substrate 40A with reference to FIG. 8 will be given in this order. Thereafter, a manufacturing method of the multilayer printed wiring board 60 will be explained with reference to FIGS. 9A and 9B.

A manufacturing method of the wiring substrate 10A will be explained with reference to FIG. 6.

First, the single-sided metal-foiled laminate sheet 3 that has been explained in the first embodiment is prepared. Thereafter, the reception lands 2a and the wirings 2b are formed by patterning the metal foil 2 by a known photofabrication method as illustrated in (1) of FIG. 6.

Subsequently, an adhesive protective layer 9A is formed on the rear face 1b of the single-sided metal-foiled laminate sheet 3 as illustrated in (1) of FIG. 6. The adhesive protective layer 9A includes an adhesive-agent layer 7A that covers the rear face 1b of the insulating resin film 1 and a protective film 8A that is laminated on the adhesive-agent layer 7A. The forming method of the adhesive protective layer 9A is identical to that of the adhesive protective layer 17 in the first embodiment, and therefore, explanations thereof are omitted.

Subsequently, the adhesive protective layer 9A and the insulating resin film 1 are partially removed, thereby forming bottomed via holes each having a bottom face with the metal foil 2 (the reception land 2a) exposed therefrom. Thereafter, a conductive pastes 6A are filled into the bottomed via holes by a printing method.

Subsequently, the protective film 8A is peeled off from the adhesive-agent layer 7A, thereby causing respective parts of the conductive pastes 6A to protrude from the adhesive-agent layer 7A as illustrated in (3) of FIG. 6.

The above processes provide the wiring substrate 10A illustrated in (3) of FIG. 6.

Next, a manufacturing method of the wiring substrate 20A will be explained with reference to FIG. 7.

First, the double-sided metal-foiled laminate sheet 14 that has been explained in the first embodiment is prepared. Thereafter, the piercing masks 12a, the reception lands 12b and the wirings 12c are formed by patterning the metal foil 12 by a known photofabrication method as illustrated in (1) of FIG. 7. Similarly, the reception lands 13a, the wirings 13b, and piercing masks 13c are formed by patterning the metal foil 13. In this way, in the third embodiment, the piercing masks are formed on the both sides of the double-sided metal-foiled laminate sheet 14.

Subsequently, an adhesive protective film 35 having a weak adhesive layer (not illustrated) formed on one side thereof is attached to the double-sided metal-foiled laminate sheet in such a way that the weak adhesive layer contacts with the front face 11a of the insulating resin film 11 and buries the patterned metal foil 12 (the piercing masks 12a, the reception lands 12b, and the wirings 12c) as illustrated in (1) of FIG. 7.

Also, an adhesive protective film 36 having a weak adhesive layer formed on one side thereof is attached to the double-sided metal-foiled laminate sheet 14 in such a way that the weak adhesive layer (not illustrated) contacts with the rear face 11b of the insulating resin film 11 and buries the patterned metal foil 13 (the reception lands 13a, the wiring 13b, and the piercing masks 13c) as illustrated in (1) of FIG. 7.

Subsequently, the adhesive protective film 35 and the insulating resin film 11 are partially removed, thereby forming bottomed step via holes each having a middle part with the piercing mask 12a exposed therefrom and a bottom face with the reception land 13a exposed therefrom, and thereafter, conductive pastes 19C are filled into the bottomed via holes by a printing method as illustrated in (2) of FIG. 7.

Also, the adhesive protective film 36 and the insulating resin film 11 are partially removed, thereby forming bottomed step via holes each having a middle part with the piercing mask 13c exposed therefrom and a bottom face with the reception land 12b exposed therefrom, and thereafter, conductive pastes 19D are filled into the bottomed step via holes using a printing method as illustrated in (2) of FIG. 7.

The conductive pastes 19C and 19D may be printed after the bottomed step via holes are formed on the both sides of the double-sided metal-foiled laminate sheet 14.

Subsequently, the adhesive protective film 35 is peeled off from the insulating resin film 11, thereby causing respective parts of the conductive pastes 19C to protrude from the piercing masks 12a as illustrated in (3) of FIG. 7. Similarly, the adhesive protective film 36 is peeled off from the insulating resin film 11, thereby causing respective parts of the conductive pastes 190 to protrude from the piercing masks 13c.

The above processes provide the wiring substrate 20A illustrated in (3) of FIG. 7.

Next, a manufacturing method of the wiring substrate 40A will be explained with reference to FIG. 8.

First, the single-sided metal-foiled laminate sheet 23 that has been explained in the second embodiment is prepared. Thereafter, in the single-sided metal-foiled laminate sheet 23, the reception lands 22a and the wirings 22b are formed by patterning the metal foil 22 by a known photofabrication method as illustrated in (1) of FIG. 8.

Subsequently, an adhesive protective layer 9B is formed on the front face 21a of the single-sided metal-foiled laminate sheet 23 as illustrated in (1) of FIG. 8. The adhesive protective layer 9B includes an adhesive-agent layer 7B that covers the front face 21a of the insulating resin film 21 and a protective film 83 that is laminated on the adhesive-agent layer 7B. The forming method of the adhesive protective layer 9B is identical to that of the adhesive protective layer 17 in the first embodiment, and therefore, explanations thereof are omitted.

Subsequently, the adhesive protective layer 9B and the insulating resin film 21 are partially removed, thereby forming bottomed via holes each having a bottom face with the metal foil 22 (the reception land 22a) exposed therefrom, and thereafter, conductive pastes 28A are filled into the bottomed via holes by a printing method, as illustrated in (2) of FIG. 8.

Subsequently, the protective film 8B is peeled off from the adhesive-agent layer 7B, thereby causing respective parts of the conductive pastes 28A from the adhesive-agent layer 7B as illustrated in (3) of FIG. 8.

Figure 8:
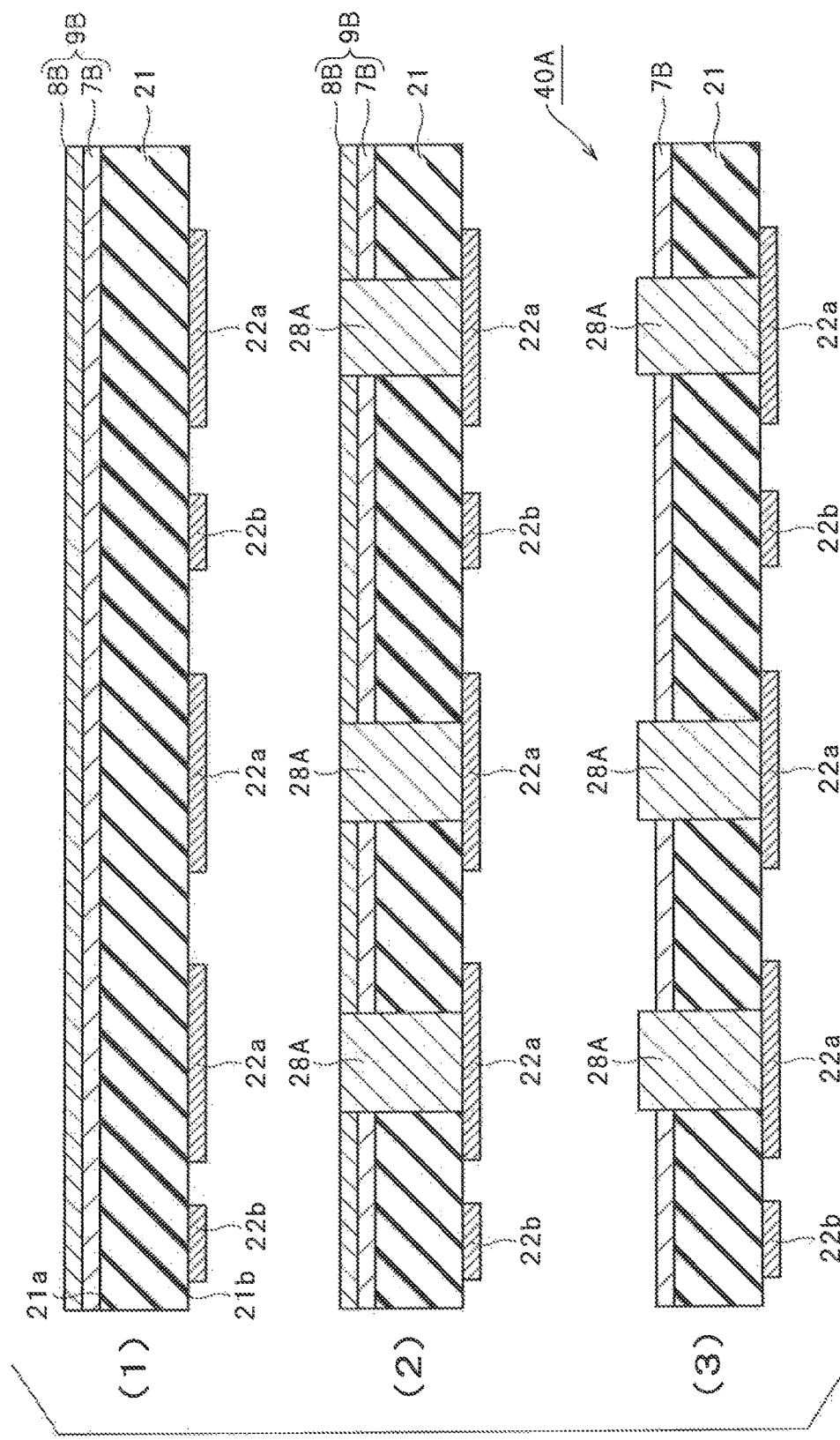
FIG. 8 is a process sectional view for explaining a manufacturing method of a wiring substrate 40A of the multilayer printed wiring board 60 according to the third embodiment of the present invention.

The above processes provide the wiring substrate 40A illustrated in (3) of FIG. 8.

Next, a manufacturing method of the multilayer printed wiring board 60 will be explained with reference to FIGS. 9A and 9B.

As illustrated in FIG. 9A, the wiring substrate 10A, the wiring substrate 20A, and the wiring substrate 40A are laminated in such a way that the protruding parts of the conductive pastes 6A of the wiring substrate 10A come into contact with the respective protruding parts of the conductive pastes 19C of the wiring substrate 20A and the protruding parts of the conductive pastes 28A of the wiring substrate 40A come into contact with the respective reception lands 13a of the wiring substrate 20A. The wiring substrates 10A, 20A, and 40A that are laminated in this way are heated to be integrated with one another (a laminating process). The laminating process is identical to that in the first embodiment, and therefore, detailed explanations thereof are omitted.

The above processes provide the multilayer printed wiring board 60 having the first to fourth wiring layers as illustrated in FIG. 9B. The first to fourth wiring layers are identical to those that have been explained in the second embodiment.

As illustrated in FIG. 9B, the multilayer printed wiring board 60 includes conductive vias 61 to 63. The conductive vias 61 and 62 connect all of the first to fourth wiring layers electrically. The conductive via 63 connects the first wiring layer, the third wiring layer, and the fourth wiring layer electrically by skipping the second wiring layer.

The conductive via 61 is formed of conductive via parts 61a, 61b, and 61c. The conductive via 62 is formed of conductive via parts 62a, 62b, and 62c. The conductive via 63 is formed of conductive via parts 63a, 63b, and 63c.

As is clear from FIGS. 3B and 9B, a conductive via connecting any two or more layers of the first to fourth wiring layers can be formed.

As described above, in the third embodiment, the multilayer printed wiring board 60 having four wiring layers connected electrically with one another through the conductive vias is manufactured by laminating three wiring substrates (the wiring substrate 10A, the wiring substrate 20A, and the wiring substrate 40A).

According to the third embodiment, three wiring substrates are sufficient for four wiring layers. Thus, the number of materials required for manufacturing the multilayer printed wiring board can be reduced and the manufacturing process can be simplified.

Since it suffices that only the three wiring substrates are laminated, deterioration in yield caused by positional deviation can be avoided. Since the margin for positional deviation does not need to be large, the above manufacturing method is effective for achieving the high density of the multilayer printed wiring board.

Furthermore, in the third embodiment, the piercing masks having a large diameter are formed on the both sides of the insulating resin film, thereby averaging the pattern densities of the front and rear faces of the insulating resin film 11. Thus, the high density of the entire multiple printed wiring board can be achieved.

Therefore, according to the third embodiment, it is possible to provide a multilayer printed wiring board with an excellent yield that can reduce the manufacturing cost and easily achieve the high density.

Three embodiments according to the present invention have been explained. In these embodiments, the multilayer printed wiring board having three or four wiring layers has been explained. However, the present invention can be also applied to a multilayer printed wiring board having five or more wiring layers.

The above insulating resin films 1, 11, and 21 are not limited to a liquid crystal polymer film. For example, the insulating resin films 1, 11, and 21 may be an insulating resin film such as a polyimide film or a polyethylene terephthalate that is used for a flexible printed wiring board, or may be formed of a hard insulating resin such as glass epoxy.

Those skilled in the art may conceive additional effects and various modifications of the present invention based on the above descriptions. However, an aspect of the present invention is not limited to the embodiments that have been explained above. Constituent requirements from the different embodiments may be combined as appropriate. Various additions, modifications, and partial removal can be made within the conceptual ideas and principles of the present invention derived from the subjects set forth in the claims and the equivalent thereof.

REFERENCE SIGNS LIST 1, 11, 21 INSULATING RESIN FILM
1a, 11a, 21a FRONT FACE
1b, 11b, 21b REAR FACE
2, 12, 13, 22 METAL FOIL
2a RECEPTION LAND
2b WIRING
3, 23 SINGLE-SIDED METAL-FOILED LAMINATE SHEET
4, 35, 36 ADHESIVE PROTECTIVE FILM
5, 18b, 18d, 27 BOTTOMED VIA HOLE
6, 6A, 19, 19A, 19B, 19C, 19D, 28, 28A CONDUCTIVE PASTE
6a, 19a, 28a PROTRUDING PART
7A, 7B, 15, 15A, 15B, 247 ADHESIVE-AGENT LAYER
8A, 8B, 16, 16A, 16B, 25 PROTECTIVE FILM
9A, 17, 17A, 17B, 26 ADHESIVE PROTECTIVE LAYER
10, 10A, 20, 20A, 40, 40A WIRING SUBSTRATE
12a, 13c PIERCING MASK
12b, 13a, 22a RECEPTION LAND
12c, 13b, 22b WIRING
14 DOUBLE-SIDED METAL-FOILED LAMINATE SHEET
18a, 18c BOTTOMED STEP VIA HOLE
30, 50, 60 MULTILAYER PRINTED WIRING BOARD
31, 32, 33, 34, 51, 52, 53, 61, 62, 63 CONDUCTIVE VIA
31a UPPER CONDUCTIVE VIA PART
31b LOWER CONDUCTIVE VIA PART
32a, 32b, 34a, 34b, 51a, 51b, 51c, 52a, 52b, 52c, 53a, 53b, 53c, 61a, 61b, 61c, 62a, 62b, 62c, 63a, 63b, 63c CONDUCTIVE VIA PART

The invention claimed is:

1. A manufacturing method of a multilayer printed wiring board comprising:
attaching an adhesive protective film having a weak adhesive layer formed on one side thereof to a single-sided metal-foiled laminate sheet having a first insulating resin film and a first metal foil on a front face of the first insulating resin film in such a way that the weak adhesive layer contacts with a rear face of the first insulating resin film;
forming a bottomed via hole that has a bottom face with the first metal foil exposed therefrom by partially removing the adhesive protective film and the first insulating resin film;
first printing of filling a conductive paste into the bottomed via hole by a printing method;
peeling off the adhesive protective film from the first insulating resin film and causing a part of the conductive paste filled in the bottomed via hole to protrude from the first insulating resin film to obtain a first wiring substrate;
forming, on a double-sided metal-foiled laminate sheet having a second insulating resin film and second and third metal foils respectively provided on a front face and a rear face of the second insulating resin film, a piercing mask by patterning the second metal foil;
forming an adhesive protective layer including an adhesive-agent layer that covers the front face of the second insulating resin film and buries the patterned second metal foil and a protective film that is laminated on the adhesive-agent layer;
forming a bottomed step via hole that has a middle part with the piercing mask exposed therefrom and a bottom face with the third metal foil exposed therefrom by partially removing the adhesive protective layer and the second insulating resin film;
second printing of filling a conductive paste into the bottomed step via hole by a printing method;
peeling off the protective film from the adhesive-agent layer and causing a part of the conductive paste filled in the bottomed step via hole to protrude from the adhesive-agent layer to obtain a second wiring substrate; and
laminating in which the first wiring substrate and the second wiring substrate are laminated in such a way that a protruding part of the conductive paste filled in the bottomed via hole of the first wiring substrate comes into contact with a protruding part of the conductive paste filled in the bottomed step via hole of the second wiring substrate, and the laminated first and second wiring substrates are heated to be integrated with each other.

2. The manufacturing method of a multilayer printed wiring board according to claim 1, wherein heating is performed at a predetermined laminating-process temperature in the laminating, thereby achieving metal bonding among metal particles included in the conductive pastes filled in the bottomed via hole and the bottomed step via hole and metal bonding among the metal particles and the first to third metal foils, and substantially completing heat-curing reaction of resin binder included in the conductive pastes and the adhesive-agent layer.

3. The manufacturing method of a multilayer printed wiring board according to claim 1, wherein in the first printing and/or the second printing, a conductive paste that includes metal particles made of In, SnIn, or SnBi is used.

4. The manufacturing method of a multilayer printed wiring board according to claim 1, wherein
the first to third metal foils are copper foils, and
in the first printing and/or the second printing, a conductive paste that includes metal particles made of Sn, Zn, Al, Ag, Ni, Cu or an alloy of these metals is used.

5. The manufacturing method of a multilayer printed wiring board according to claim 1, wherein before the laminating, the first metal foil and the third metal foil are patterned to form respective predetermined wiring patterns.

6. The manufacturing method of a multilayer printed wiring board according to claim 1, wherein after the laminating, the first metal foil and the third metal foil are patterned to form respective predetermined wiring patterns.

7. The manufacturing method of a multilayer printed wiring board according to claim 6, wherein the first metal foil and the third metal foil are simultaneously patterned by both-side simultaneous exposure.

8. The manufacturing method of a multilayer printed wiring board according to claim 1, further comprising:
forming, in a second single-sided metal-foiled laminate sheet having a third insulating resin film and a fourth metal foil on a rear face of the third insulating resin film, a second adhesive protective layer having a second adhesive-agent layer that covers a front face of the third insulating resin film and a second protective film that is laminated on the adhesive-agent layer;

forming a second bottomed via hole having a bottom face with the fourth metal foil exposed therefrom by partially removing the second adhesive protective layer and the third insulating resin film;

filling a conductive paste into the second bottomed via hole by a printing method; and peeling off the second protective film from the second adhesive-agent layer and causing a part of the conductive paste filled in the second bottomed via hole to protrude from the second adhesive-agent layer, thereby obtaining a third wiring substrate, wherein in the laminating, the first to third wiring substrates are laminated in such a way that a protruding part of the conductive paste filled in the second bottomed via hole of the third wiring substrate comes into contact with a reception land that is formed by patterning the third metal foil of the second wiring substrate.

* * * * *